(12) United States Patent
Derks et al.

(10) Patent No.: US 9,778,574 B2
(45) Date of Patent: Oct. 3, 2017

(54) APPARATUS, A DEVICE AND A DEVICE MANUFACTURING METHOD

(71) Applicant: ASML Netherlands B.V., Veldhoven (NL)

(72) Inventors: Sander Catharina Reinier Derks, Veldhoven (NL); Eric Willem Felix Casimiri, Veldhoven (NL); Marcel Mathijs Theodore Dierichs, Veldhoven (NL); Sumant Sukdew Ramanujan Oemrawsingh, Veldhoven (NL); Wilhelmus Theodorus Anthonius Johannes Van Den Einden, Veldhoven (NL); Johannes Fransiscus Maria Velthuis, Veldhoven (NL); Alexander Nikolov Zdravkov, Veldhoven (NL); Wassim Zein Eddine, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/033,580

(22) PCT Filed: Nov. 4, 2014

(86) PCT No.: PCT/EP2014/073643
§ 371 (c)(1),
(2) Date: Apr. 29, 2016

(87) PCT Pub. No.: WO2015/074859
PCT Pub. Date: May 28, 2015

(65) Prior Publication Data
US 2016/0282723 A1    Sep. 29, 2016

(30) Foreign Application Priority Data

Nov. 25, 2013  (EP) ..................................... 13194257
Jun. 26, 2014  (EP) ..................................... 14174030

(51) Int. Cl.
    G03B 27/52    (2006.01)
    G03F 7/20     (2006.01)
    (Continued)

(52) U.S. Cl.
    CPC ......... G03F 7/70033 (2013.01); G02B 5/003 (2013.01); G02B 5/208 (2013.01);
    (Continued)

(58) Field of Classification Search
    CPC .......... G02B 5/003; G02B 5/208; G02B 5/22; G03F 7/70033; G03F 7/70191;
    (Continued)

(56) References Cited

U.S. PATENT DOCUMENTS 7,598,508 B2 * 10/2009 Sogard ................... B82Y 10/00
                                                 250/493.1
2003/0142280 A1 * 7/2003 Bakker .................. B82Y 10/00
                                                 355/53
(Continued)

FOREIGN PATENT DOCUMENTS

EP          1335640      8/2003
WO    WO 2011/023470 A1  3/2011
WO    WO 2012/100846 A1  8/2012

OTHER PUBLICATIONS

Xue, Chenyang et al "IR Characterization of Carbon-black for Thermopile Infrared Detectors," 2010 5$^{th}$ IEEE, Jan. 20, 2010; 963-966.
(Continued)

*Primary Examiner* — Deoram Persaud
(74) *Attorney, Agent, or Firm* — Sterne, Kessler, Goldstein & Fox P.L.L.C.

(57) ABSTRACT

An apparatus comprising at least one sealing aperture (40) comprising a hollow part (41), having an inner surface (42), extending at an interface between different zones (50;60) of
(Continued)

the apparatus; and a member (43) positioned in the hollow part configured to substantially transmit EUV radiation and to substantially filter non-EUV radiation at the interface; wherein the inner surface of the hollow part has a surface treatment configured to increase absorption of the non-EUV radiation that is transferred by the member to the hollow part.

15 Claims, 4 Drawing Sheets

(51) Int. Cl.
- *G02B 5/00* (2006.01)
- *G02B 5/20* (2006.01)
- *G02B 5/22* (2006.01)
- *H05G 2/00* (2006.01)
- *H01J 5/18* (2006.01)

(52) U.S. Cl.
CPC ........... *G02B 5/22* (2013.01); *G03F 7/70191* (2013.01); *G03F 7/70575* (2013.01); *G03F 7/70633* (2013.01); *G03F 7/70875* (2013.01); *G03F 7/70883* (2013.01); *G03F 7/70933* (2013.01); *H01J 5/18* (2013.01); *H05G 2/001* (2013.01)

(58) Field of Classification Search
CPC ............ G03F 7/70575; G03F 7/70633; G03F 7/70875; G03F 7/70883; G03F 7/70933; H01J 5/18; H05G 2/001
See application file for complete search history.

(56) References Cited

U.S. PATENT DOCUMENTS

| | | | |
|---|---|---|---|
| 2005/0122589 A1* | 6/2005 | Bakker | G02B 1/11 359/591 |
| 2006/0145094 A1* | 7/2006 | Wilhelmus Van Herpen | G03F 7/70575 250/492.2 |
| 2006/0160031 A1 | 7/2006 | Wurm et al. | |
| 2007/0170379 A1 | 7/2007 | Watson et al. | |
| 2010/0259744 A1* | 10/2010 | Van Herpen | G02B 5/203 355/71 |
| 2010/0288937 A1 | 11/2010 | Watanabe et al. | |
| 2011/0026002 A1 | 2/2011 | Loopstra et al. | |
| 2011/0143269 A1* | 6/2011 | Yakunin | B82Y 10/00 430/5 |
| 2011/0211185 A1* | 9/2011 | Jak | G03F 7/70191 355/71 |
| 2011/0249243 A1* | 10/2011 | Sjmaenok | G03F 7/70191 355/18 |
| 2013/0038926 A1 | 2/2013 | Soer et al. | |
| 2014/0217298 A1* | 8/2014 | Wang | G01N 21/956 250/372 |
| 2015/0192861 A1* | 7/2015 | Banine | G03F 7/70191 355/71 |

OTHER PUBLICATIONS

International Search Report directed to related International Patent Application No. PCT/EP2014/07364, mailed Jan. 20, 2015; 9 pages.
Written Opinion of the International Searching Authority directed to related International Patent Application No. PCT/EP2014/07364, mailed Jan. 20, 2015; 11 pages.

\* cited by examiner

Fig. 6

APPARATUS, A DEVICE AND A DEVICE MANUFACTURING METHOD

This application claims the benefit of EP application 13194257.5 which was filed on Nov. 25, 2013 and of EP application 14174030.8 which was filed on Jun. 26, 2014, and which are incorporated herein in its entirety by reference.

FIELD

The present invention relates to an apparatus, a device and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

A projection system may be separated from a substrate table by an intervening space which can be at least partially evacuated. The intervening space may be delimited at the location of the projection system by a solid surface from which the employed radiation is directed toward the substrate table. The intervening space may contain a hollow part that is located between the solid surface and the substrate table and is situated around the path of the radiation. Means may be provided for continually flushing the inside of the hollow part with a flow of gas. This is known as a dynamic gas lock.

The hollow part may be cone-shaped and may be covered by a membrane through which the radiation must travel before impinging on the substrate. The membrane absorbs some of the radiation incident on it. The membrane may radiate some radiation towards the substrate, which causes a thermal load on the substrate, in turn leading to overlay errors.

It is desirable to provide a lithographic apparatus and a device manufacturing method in which undesired overlay errors are reduced.

SUMMARY OF THE INVENTION

According to an aspect of the invention, there is provided an apparatus comprising: at least one sealing aperture comprising a hollow part, having an inner surface, extending at an interface between different zones of the apparatus; and a member positioned in the hollow part configured to substantially transmit EUV radiation and to substantially filter non-EUV radiation at the interface; wherein the inner surface of the hollow part has a surface treatment configured to increase absorption of the non-EUV radiation that is transferred by the member to the hollow part.

According to an aspect of the invention, there is provided an apparatus comprising: at least one sealing aperture comprising a hollow part, having an inner surface, extending at an interface between different zones of the apparatus; and a member positioned in the hollow part configured to substantially transmit EUV radiation and to substantially filter non-EUV radiation at the interface; wherein the inner surface of the hollow part has a higher absorptivity value than stainless steel at 295K for the non-EUV radiation that is transferred by the member to the hollow part.

According to an aspect of the invention, there is provided an apparatus comprising: at least one sealing aperture comprising a hollow part, having an inner surface, extending at an interface between different zones of the apparatus; and a member positioned in the hollow part configured to substantially transmit EUV radiation and to substantially filter non-EUV radiation between said zones; wherein the hollow part comprises a conditioning system to condition the temperature of the hollow part.

According to an aspect of the invention, there is provided an apparatus comprising: at least one sealing aperture at an interface between different zones of the apparatus; and a member positioned in the aperture configured to substantially transmit EUV radiation; wherein the member has an upstream surface and a downstream surface, wherein at least one of the upstream surface and the downstream surface has a filtration surface treatment configured to increase filtration of non-EUV radiation between said zones, such that the member having the filtration surface treatment is configured to substantially filter the non-EUV radiation between said zones.

According to an aspect of the invention, there is provided an apparatus comprising: at least one sealing aperture at an interface between different zones of the apparatus; and a member positioned in the aperture configured to substantially transmit EUV radiation; wherein the member has an upstream surface and a downstream surface, wherein the upstream surface has an upstream containment layer of upstream containment material and the downstream surface has a downstream containment layer of downstream containment material, wherein the upstream containment layer and the downstream containment layer are configured to contain the material between the upstream containment layer and the downstream containment layer from which the member is formed.

According to an aspect of the invention, there is provided a device comprising: a frame; and a member fixed to the frame configured to substantially transmit EUV radiation; wherein the member has an upstream surface and a downstream surface, wherein at least one of the upstream surface and the downstream surface has a filtration surface treatment configured to increase filtration of non-EUV radiation, such that the member having the filtration surface treatment is configured to substantially filter the non-EUV radiation.

According to an aspect of the invention, there is provided a device manufacturing method, comprising using a lithographic apparatus to transfer a pattern from a patterning device to a substrate, wherein the lithographic apparatus comprises: at least one sealing aperture comprising a hollow part, having an inner surface, extending at an interface between different zones of the apparatus; and a member positioned in the hollow part configured to substantially transmit EUV radiation and to substantially filter non-EUV radiation at the interface; wherein the inner surface of the hollow part has a surface treatment configured to increase absorption of the non-EUV radiation that is transferred by the member to the hollow part.

According to an aspect of the invention, there is provided a device manufacturing method, comprising using a lithographic apparatus to transfer a pattern from a patterning device to a substrate, wherein the lithographic apparatus comprises: at least one sealing aperture comprising a hollow part, having an inner surface, extending at an interface between different zones of the apparatus; and a member positioned in the hollow part configured to substantially transmit EUV radiation and to substantially filter non-EUV radiation at the interface; wherein the inner surface of the hollow part has a higher absorptivity value than stainless steel at 295K for the non-EUV radiation that is transferred by the member to the hollow part.

According to an aspect of the invention, there is provided a device manufacturing method, comprising using a lithographic apparatus to transfer a pattern from a patterning device to a substrate, wherein the lithographic apparatus comprises: at least one sealing aperture comprising a hollow part, having an inner surface, extending at an interface between different zones of the apparatus; and a member positioned in the hollow part configured to substantially transmit EUV radiation and to substantially filter non-EUV radiation between said zones; wherein the hollow part comprises a conditioning system to condition the temperature of the hollow part.

According to an aspect of the invention, there is provided a device manufacturing method, comprising using a lithographic apparatus to transfer a pattern from a patterning device to a substrate, wherein the lithographic apparatus comprises: at least one sealing aperture at an interface between different zones of the apparatus; and a member positioned in the hollow part configured to substantially transmit EUV radiation; wherein the member has an upstream surface and a downstream surface, wherein at least one of the upstream surface and the downstream surface has a filtration surface treatment configured to increase filtration of non-EUV radiation between said zones, such that the member having the filtration surface treatment is configured to substantially filter the non-EUV radiation between said zones.

According to an aspect of the invention, there is provided a device manufacturing method, comprising using a lithographic apparatus to transfer a pattern from a patterning device to a substrate, wherein the lithographic apparatus comprises: at least one sealing aperture at an interface between different zones of the apparatus; and a member positioned in the hollow part configured to substantially transmit EUV radiation; wherein the member has an upstream surface and a downstream surface, wherein the upstream surface has an upstream containment layer of upstream containment material and the downstream surface has a downstream containment layer of downstream containment material, wherein the upstream containment layer and the downstream containment layer are configured to contain the material between the upstream containment layer and the downstream containment layer from which the member is formed.

BRIEF DESCRIPTION OF THE DRAWINGS

Embodiments of the invention will now be described, by way of example only, with reference to the accompanying schematic drawings in which corresponding reference symbols indicate corresponding parts, and in which.

The features and advantages of the present invention will become more apparent from the detailed description set forth below when taken in conjunction with the drawings, in

DETAILED DESCRIPTION

Figure 1:
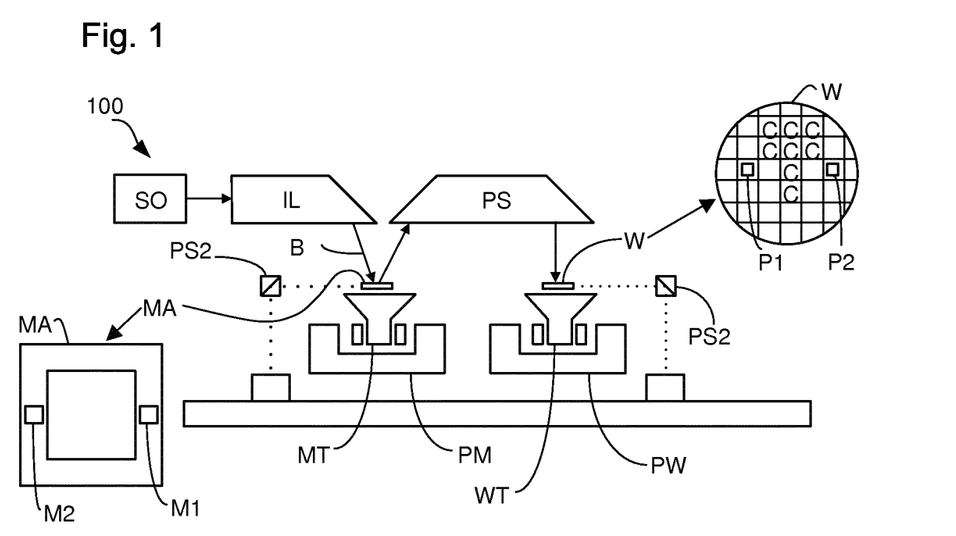
FIG. 1 depicts a lithographic apparatus according to an embodiment of the invention.

FIG. 1 schematically depicts a lithographic apparatus 100 including a source collector module SO according to one embodiment of the invention. The apparatus comprises:

an illumination system (illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device MA, the design of the lithographic apparatus 100, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam B with a pattern in its cross-section such as to create a pattern in a target portion C of the substrate W. The pattern imparted to the radiation beam B may correspond to a particular functional layer in a device being created in the target portion C, such as an integrated circuit (IC).

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect incoming radiation in different directions. The tilted mirrors impart a pattern in a radiation beam B, which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus 100 is of a reflective type (e.g., employing a reflective mask).

The lithographic apparatus 100 may be of a type having two (dual stage) or more substrate tables WT (and/or two or more support structures MT, e.g. mask tables). In such a "multiple stage" lithographic apparatus 100 the additional substrate tables WT and/or support structures MT may be used in parallel, or preparatory steps may be carried out on one or more substrate tables WT and/or support structures MT while one or more other substrate tables WT and/or support structures MT are being used for exposure.

Referring to FIG. 1, the illumination system IL receives EUV radiation from the source collector module SO. Methods to produce the EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits the EUV radiation, which is collected using a radiation collector, disposed in the source collector module SO. The laser and the source collector module SO may be separate entities, for example when a $CO_2$ laser is used to provide the laser beam for fuel excitation.

In such cases, the laser is not considered to form part of the lithographic apparatus 100 and the laser beam is passed from the laser to the source collector module SO with the aid of a beam delivery system comprising, for example, suitable directing mirrors and/or a beam expander. In other cases the initial source of radiation may be an integral part of the source collector module SO, for example when the initial source of radiation is a discharge produced plasma EUV generator, often termed as a DPP source.

The illumination system IL may comprise an adjuster for adjusting the angular intensity distribution of the radiation beam B. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as faceted field and pupil mirror devices. The illumination system IL may be used to condition the radiation beam B, to have a desired uniformity and intensity distribution in its cross-section.

The radiation beam B is incident on the patterning device (e.g., mask) MA, which is held on the support structure (e.g., mask table) MT, and is patterned by the patterning device MA. After being reflected from the patterning device (e.g., mask) MA, the radiation beam B passes through the projection system PS, which focuses the radiation beam B onto a target portion C of the substrate W. The first positioner PM and a first position sensor PS1 (e.g., an interferometric device, linear encoder or capacitive sensor) can be used to accurately position the patterning device (e.g., mask) MA with respect to the path of the radiation beam B. Similarly, with the aid of the second positioner PW and a second position sensor PS2 (e.g., an interferometric device, linear encoder or capacitive sensor), the substrate table WT can be moved accurately, e.g., so as to position different target portions C in the path of the radiation beam B. The patterning device (e.g., mask) MA may be aligned using mask alignment marks M1, M2. The substrate W may be aligned using substrate alignment marks P1, P2.

The depicted lithographic apparatus 100 could be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device MA, and the substrate table WT is moved or scanned while a pattern imparted to the radiation beam B is projected onto a target portion C. In this mode, generally a pulsed radiation source is employed and the programmable patterning device MA is updated as required after each movement of the substrate table WT or in between successive radiation pulses during a scan. This mode of operation can be readily applied to maskless lithography that utilizes a programmable patterning device MA, such as a programmable mirror array of a type as referred to above.

Combinations and/or variations on the above described modes of use or entirely different modes of use may also be employed.

Figure 2:
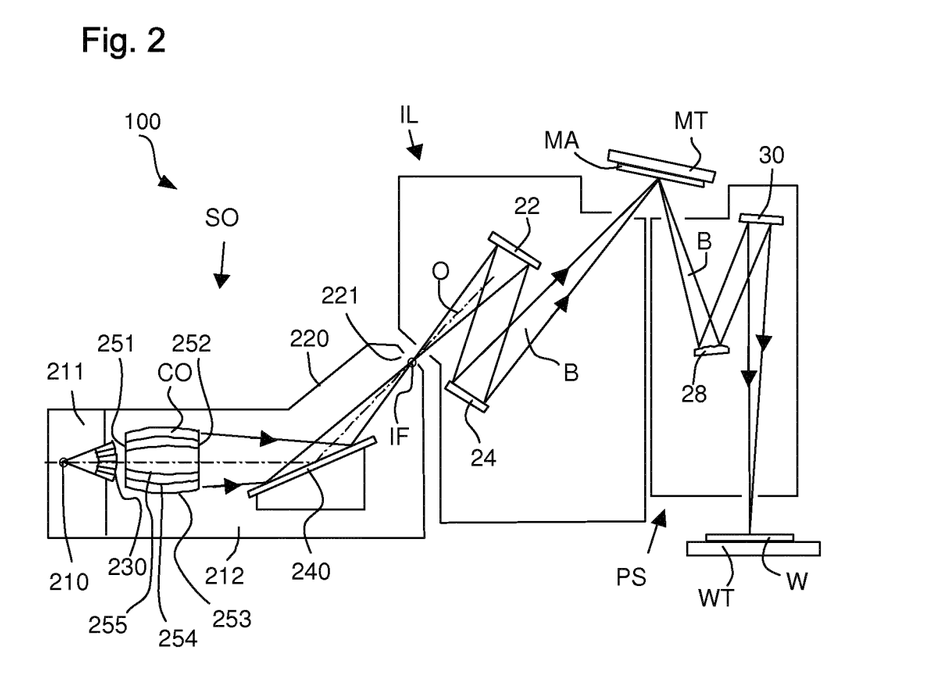
FIG. 2 is a more detailed view of the apparatus 100.

FIG. 2 shows the lithographic apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the EUV radiation emitting plasma 210, which is very hot, is created to emit radiation in the EUV range of the electromagnetic spectrum. The EUV radiation emitting plasma 210 is created by, for example, an electrical discharge causing the EUV radiation emitting plasma 210 to be at least partially ionized. Partial pressures of, for example, 10 Pa of Xe, Li, Sn vapor or any other suitable gas or vapor may be required for efficient generation of the EUV radiation. In an embodiment, an EUV radiation emitting plasma 210 of excited tin (Sn) is provided to produce the EUV radiation.

The EUV radiation emitted by the EUV radiation emitting plasma 210 is passed from a source chamber 211 into a collector chamber 212 via an optional gas barrier or contaminant trap 230 (in some cases also referred to as contaminant barrier or foil trap) that is positioned in or behind an opening in source chamber 211. The contaminant trap 230 may include a channel structure. The contaminant trap 230 may also include a gas barrier or a combination of a gas barrier and a channel structure. The contaminant trap 230 as further indicated herein at least includes a channel structure, as known in the art.

The collector chamber 212 may include a radiation collector CO, which may be a so-called grazing incidence collector. The radiation collector CO has an upstream radiation collector side 251 and a downstream radiation collector side 252. Radiation that traverses the radiation collector CO can be reflected off a grating spectral filter 240 to be focused in a virtual source point IF. The virtual source point IF is commonly referred to as the intermediate focus, and the source collector module SO is arranged such that the virtual source point IF is located at or near an enclosing structure opening 221 in the enclosing structure 220. The virtual source point IF is an image of the EUV radiation emitting plasma 210.

Subsequently the EUV radiation traverses the illumination system IL, which may include a faceted field mirror device 22 and a faceted pupil mirror device 24 arranged to provide a desired angular distribution of the radiation beam B, at the patterning device MA, as well as a desired uniformity of radiation intensity at the patterning device MA. Upon reflection of the radiation beam B at the patterning device MA, held by the support structure MT, the radiation beam B is imparted with a pattern. The radiation beam B with the imparted pattern is imaged by the projection system PS via reflective elements 28, 30, e.g. mirrors, onto a substrate W held by the substrate table WT, e.g. wafer stage.

More elements than shown may generally be present in the illumination system IL and the projection system PS. The grating spectral filter 240 may optionally be present, depending upon the type of lithographic apparatus 100. Further, there may be more reflective elements, e.g. mirrors, present than those shown in the Figures. For example there may be one to six additional reflective elements present in the projection system PS than shown in FIG. 2.

The radiation collector CO, as illustrated in FIG. 2, is depicted as a nested collector with grazing incidence reflectors 253, 254, 255, just as an example of a radiation collector (or collector mirror or collector optic) CO. The grazing incidence reflectors 253, 254, 255 are disposed axially symmetric around an optical axis O. A radiation collector CO of this type is preferably used in combination with a discharge produced plasma source, often called a DPP source.

Figure 3:
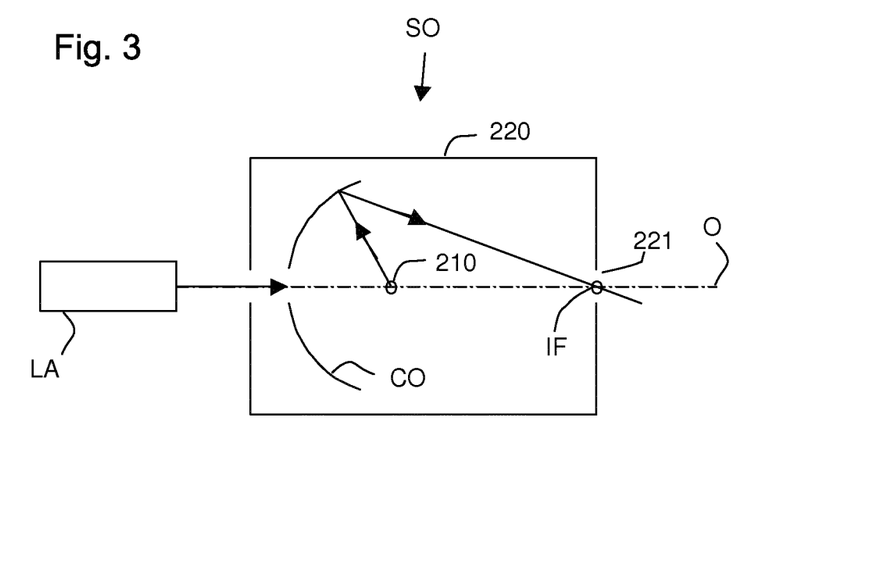
FIG. 3 is a more detailed view of the source collector module SO of the apparatus of FIGS. 1 and 2.

Alternatively, the source collector module SO may be part of an LPP radiation system as shown in FIG. 3. A laser LA is arranged to deposit a laser beam of laser energy into a fuel, such as xenon (Xe), tin (Sn) or lithium (Li), creating the EUV radiation emitting plasma 210, which is highly ionized, with electron temperatures of several 10's of eV. The EUV radiation generated during de-excitation and recombination of these ions is emitted from the EUV radiation emitting plasma 210, collected by a near normal incidence radiation collector CO and focused onto the enclosing structure opening 221 in the enclosing structure 220.

Figure 4:
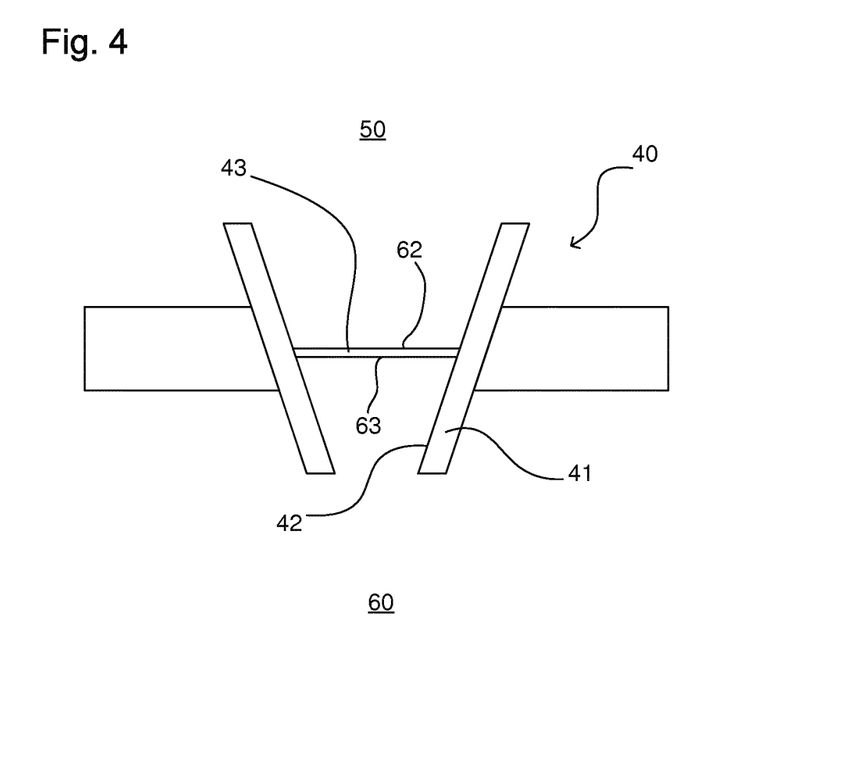
FIG. 4 depicts schematically part of a lithographic apparatus according to an embodiment of the present invention.

In an embodiment the lithographic apparatus 100 is configured to project a pattern from a patterning device MA onto a substrate W. As depicted in FIG. 4, in an embodiment an apparatus comprises at least one sealing aperture 40. In an embodiment the apparatus is a lithographic apparatus 100. In the description below, the invention is described with reference to the apparatus being a lithographic apparatus 100. The sealing aperture 40 comprises a hollow part 41. The hollow part 41 extends at an interface between different zones 50, 60 of the lithographic apparatus 100. In an embodiment the hollow part 41 forms a hollow tube. In an embodiment the hollow part 41 is cone-shaped. The sealing aperture 40 may form part of a dynamic gas lock.

FIG. 4 depicts part of a lithographic apparatus 100 according to an embodiment of the invention. As depicted in FIG. 4, in an embodiment the lithographic apparatus 100 comprises a member 43. The member 43 is positioned in the hollow part 41. In an embodiment the member 43 is coupled to the hollow part 41. In an embodiment the member 43 is configured to substantially transmit EUV radiation and to substantially filter non-EUV radiation between the zones 50, 60. The member 43 is substantially transparent for EUV radiation. It is unavoidable that the member 43 will absorb some EUV radiation. However, the level of absorption will be as small as can be achieved. In an embodiment the member 43 substantially filters (i.e. reflects or absorbs) substantially all other radiation. In an embodiment the member 43 is positioned within the hollow part 41. The member 43 may extend across the cross-section of the hollow part 41.

The member 43 is configured to reduce the amount of non-desired radiation that is transmitted between the zones 50, 60 of the lithographic apparatus 100. In an embodiment the sealing aperture 40 extends at least between a substrate zone 60 and an optics zone 50. The substrate zone 60 is configured for holding at least one substrate W. The optics zone 50 contains projection optics of the lithographic apparatus 100. For example, at least a part of the projection system PS may be contained within the optics zone 50.

The invention will be described with reference to the optics zone 50 and the substrate zone 60. The invention will be described with reference to reducing thermal loads at the substrate W. However, the sealing aperture 40 may be between other different zones of the lithographic apparatus 100. When the sealing aperture 40 is between other different zones of the lithographic apparatus 100, thermal loads on other components (e.g. the patterning device MA) may be reduced.

For example, in an embodiment the sealing aperture 40 extends between a patterning device zone and the optics zone 50. The patterning device zone comprises a support structure (e.g. a mask table) MT for a patterning device MA. As another example, in an embodiment the sealing aperture 40 extends between an optics zone 50 and an illuminator zone. The illuminator zone includes an illumination system (illuminator) IL configured to condition a radiation beam B (e.g. EUV radiation). As a further example, in an embodiment the sealing aperture 40 extends between a source zone and an illuminator zone. The source zone includes a source collector module SO.

In an embodiment the member 43 reduces the amount of non-desired radiation that reaches the substrate W. The non-desired light may include deep ultraviolet (DUV) radiation, infrared (IR) radiation, etc. In an embodiment the desired radiation is EUV radiation and the non-desired radiation is non-EUV radiation. In an embodiment the non-EUV radiation comprises IR radiation and/or DUV radiation, etc. For example, the laser LA for exciting a fuel to provide the plasma may output IR radiation. As another example, the EUV radiation emitting plasma 210 may emit some IR radiation. In an embodiment the laser LA outputs radiation having a wavelength in the range of from about 1 µm to about 15 µm, for example about 10.6 µm.

In an embodiment the member 43 is a membrane. In an embodiment the member 43 is a multi-lattice membrane. A multi-lattice membrane is a membrane that comprises a plurality of lattices. By providing that the membrane comprises a plurality of lattices, the mechanical strength of the membrane is improved. In an embodiment the member 43 is thin. The member 43 may have a thickness of at most about 75 nm, or at most about 50 nm. For example, the member 43 may have a thickness of about 25 nm. In an embodiment the member 43 is attached to a member frame (not shown). The member frame is configured to keep the member 43 in tension. In an embodiment the hollow part 41 comes in two parts. The member frame fits between the two parts of the hollow part 41. This makes it easier to manufacture the lithographic apparatus 100.

In an embodiment an inner surface 42 of the hollow part 41 has a surface treatment. The surface treatment may be configured to increase absorption of the non-EUV radiation transferred by the member 43 to the hollow part 41. In an embodiment the non-EUV radiation comprises IR radiation. In an embodiment the non-EUV radiation comprises DUV radiation. By providing the surface treatment to the inner surface 42 of the hollow part 41, there is a decrease of thermal load on the substrate W. In turn, the reduction in the thermal load of the substrate W reduces overlay errors.

In an embodiment the EUV radiation is transmitted from an upstream side of the member 43 to a downstream side of the member 43. For example in an embodiment the EUV radiation is transmitted from the optics zone 50 to the substrate zone 60. The optics zone 50 is on the upstream side of the member 43. The substrate zone 60 is on the downstream side of the member 43.

In an embodiment the surface treatment is on the downstream side of the member 43. By providing the surface treatment on the downstream side, thermal loads on the substrate W can be reduced more effectively.

In an embodiment the surface treatment is on both the upstream side and the downstream side of the member 43. By providing the surface treatment on both sides of the member 43, thermal loads towards both the substrate W and the projection system PS can be reduced. Additionally manufacturability of the hollow part 41 having the surface treatment may be improved.

At the inner surface 42 of the hollow part 41, substantially all radiation incident on it is either reflected or absorbed. By providing the surface treatment configured to increase absorption of IR radiation, reflection of IR radiation at the inner surface 42 is decreased.

The membrane 43 transmits mainly EUV radiation and absorbs or reflects mainly non-desired radiation such as DUV radiation and IR radiation. The radiation that is reflected by the member 43 and the radiation that is absorbed by the member 43 leads to problems.

Radiation that is absorbed by the member 43 heats the member 43. Having been heated by the absorbed radiation, the member 43 can radiate radiation towards the substrate W in the substrate zone 60 and towards the optics (e.g. the projection system PS) in the optics zone 50. Additionally, having been heated the member 43 can dissipate heat to gas in the vicinity of the member 43. Gas flows involving the heated gas can lead to thermal loads on the substrate W for example. Thermal loads of the substrate W can lead to overlay errors. In addition to the heated member 43 radiating energy, conduction and convection also take place in the region between the projection system PS and the substrate W. If the member 43 were not provided, then in principle only conduction and convection would take place and substantially all of the light beam from the projection system PS would reach the substrate W.

Radiation that is reflected by the member 43 can travel into the optics in the optics zone 50. The reflected radiation can lead to undesired heat loads. The undesired heat loads can in turn result in mirror drifts, which reduces the imaging quality.

Providing the surface treatment to the inner surface 42 of the hollow part 41 reduces the amount of non-desired radiation reaching the substrate W via the inner surface 42 of the hollow part 41. The thermal load on the substrate W is reduced. The overlay errors are reduced.

In an embodiment the surface treatment is configured to increase absorption of IR radiation (as opposed to other frequencies of radiation). This is because the IR radiation is the most significant type of radiation for providing undesired heat loads to the substrate W. The main frequencies of radiation that are absorbed and/or reflected by the member 43 are DUV radiation and IR radiation. At least some of the DUV radiation that is absorbed by the member 43 may be subsequently emitted by the member 43 as IR radiation.

If another type of radiation were found to be significant in increasing thermal loads on the substrate W, then the surface treatment could be chosen to be configured to increase absorption of another type of radiation (e.g. DUV radiation).

Absorption of IR radiation may be measured using absorption spectroscopy techniques. Absorption spectroscopy techniques measure the absorption of radiation as a function of frequency of radiation. The sample (e.g. the inner surface 42 of the hollow part 41) absorbs IR radiation. The intensity of the absorption may vary as a function of frequency of radiation. Absorption spectroscopy may be performed across the section of the electromagnetic spectrum of interest. For example, in measuring absorption of IR radiation, absorption spectroscopy may be performed across the IR radiation spectrum.

The IR radiation spectrum may be considered to span wavelengths from 700 µm to 1 mm, for example. In measuring the absorption of IR radiation, the mean value may be taken from several samples of IR radiation distributed approximately evenly across the IR radiation spectrum. The measurements may be taken for the inner surface 42 of the hollow part 41 at 295K.

In an embodiment the inner surface 42 of the hollow part 41 has an absorptivity of greater than 0.4 for IR radiation at 295K. By providing that the inner surface 42 of the hollow part 41 has an absorptivity of greater than 0.4 for IR radiation at 295K, the absorptivity of the inner surface 42 is greater than the absorptivity of a polished aluminum surface. The absorptivity of a polished aluminum surface may be in the region of from about 0.1 to about 0.4. Hence, the thermal load on the substrate W may be less than in the case of using a polished aluminum surface at the inner surface 42 of the hollow part 41.

The absorptivity is the fraction of incident radiation that is absorbed by a surface. In an embodiment the inner surface 42 of the hollow part 41 is substantially opaque. Substantially all of the radiation incident on the inner surface 42 is either reflected or absorbed. An absorptivity of 0.4 implies that 40% of incident radiation is absorbed and 60% of the radiation of reflected.

In an embodiment the inner surface 42 may be polished. By polishing the inner surface 42, the inner surface 42 becomes smoother (i.e. less rough). By providing that the inner surface 42 is smoother, there is a reduction in the likelihood of particles attaching to the inner surface 42 of the hollow part 41.

In an embodiment the hollow part 41 may be formed of aluminum. Aluminum is desirable because of its relatively high thermal conductance. The thermal conductance of aluminum is greater than the thermal conductance of stainless steel, which is another material that may be used for forming the hollow part 41. The thermal conductance of aluminum is about 205 W/m·K. The thermal conductance of stainless steel is about 16 W/m·K.

In an embodiment the inner surface 42 has an absorptivity of at least 0.8 for IR radiation at 295K. This means that at least 80% of the incidence radiation is absorbed by the inner surface 42. This reduces the thermal load on the substrate W.

In an embodiment the surface treatment is a coating. The coating is applied to the inner surface 42 of the hollow part 41. In an embodiment the coating is thin. For example, the coating may have a thickness in the region of from about 50 µm to about 100 µm. In an embodiment the presence of the coating does not significantly change, or have any effect on, the geometry of the inner surface 42 of the hollow part 41.

In an embodiment the coating is formed of black chromium. Black chromium has an absorptivity of IR radiation at 295K within the region of from about 0.8 to about 0.9. The coating may be formed of another suitable material having similar absorbance properties to black chromium.

Within the IR radiation spectrum, emissivity is closely correlated to absorptivity. The greater the absorptivity, the greater the emissivity. By applying the surface treatment configured to increase absorption of IR radiation, the emissivity of the inner surface 42 is also increased.

In an embodiment, the inner surface 42 of the hollow part 41 has an emissivity of at least 0.3 for IR radiation at 295K. By providing that the inner surface 42 has an emissivity of at least 0.3, the emissivity of the inner surface 42 is greater than the emissivity of a funnel made from polished aluminum, for example. A surface of polished aluminum may have an emissivity of about 0.2.

The emissivity of a material is the relative ability of its surface to emit energy by radiation. It is the ratio of energy radiated by the material to energy radiated by a block body at the same temperature. A true black body would have an emissivity of 1 while any real object has an emissivity of less than 1.

In an embodiment the inner surface 42 of the hollow part 41 has an emissivity of at least 0.9 for IR radiation at 295K. For example, in the case of providing the surface treatment in the form of black chromium coating, the emissivity of the inner surface 42 may be about 0.95.

Figure 5:
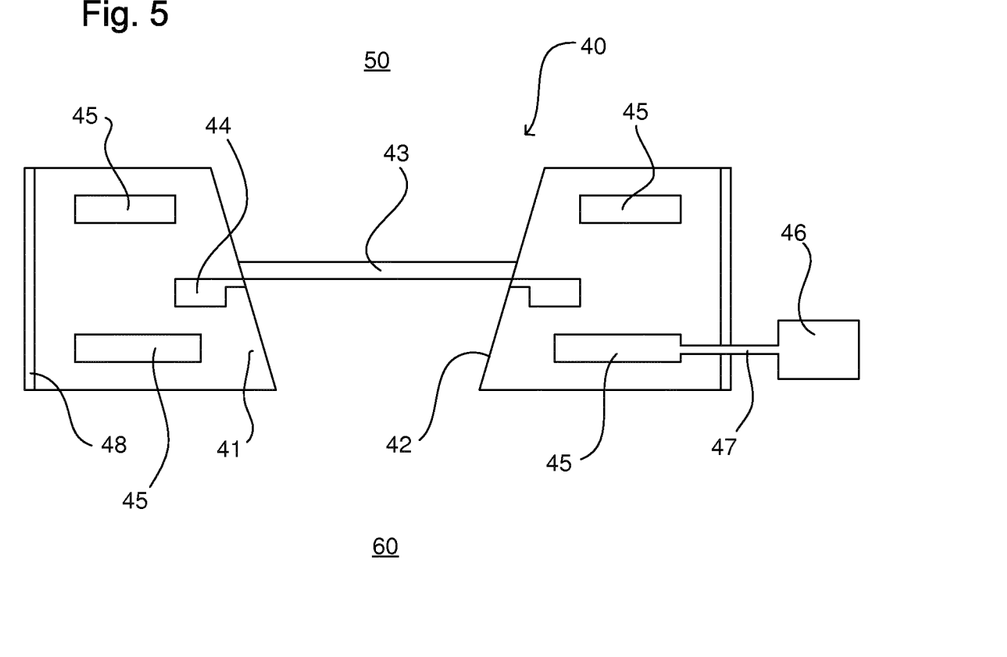
FIG. 5 depicts schematically part of a lithographic apparatus according to an embodiment of the present invention.

As depicted in FIG. 5, in an embodiment the lithographic apparatus 100 comprises at least one gas supplier 44. The gas supplier 44 is configured to supply gas to the sealing aperture 40 so as to reduce particles that flow towards the member 43 coming into contact with the member 43. There may be some outgassing from the substrate W. The outgassing results in particles travelling from the substrate W towards the member 43. When particles outgassed from the substrate W reach the member 43, the particles make the member 43 dirty. This dirtiness reduces the quality of EUV radiation that it is incident on the substrate W, thereby reducing image quality.

In an embodiment the gas supplier 44 comprises an opening at the inner surface 42 of the hollow part 41. In an embodiment the opening of the gas supplier 44 is positioned below the member 43. In an embodiment the opening of the gas supplier 44 is adjacent to member 43. The opening of the gas supplier 44 is in communication with an overpressure such that a gas flow is provided via the opening to the region inside the hollow part 41.

By providing the gas supplier 44, the flow of gas from the gas supplier 44 reduces the amount of particles that reach the member 43. When an outgassed particle travelling towards the member 43 is knocked off course by the flow of gas from the gas supplier 44, it remains at least initially within the substrate zone 60. The high velocity movement of the substrate W may subsequently move the particles out from the substrate zone 60. In this way the particles that are outgassed from the substrate W may ultimately be moved from the substrate zone 60 without dirtying the member 43.

The gas supplier 44 is optional. When the gas supplier 44 is provided, the member 43 having been heated by absorbing radiation can dissipate heat to the gas flow provided by the gas supplier 44. The heated gas flow transfers a heat load onto the substrate W leading to overlay errors.

When the gas supplier 44 is provided, the heat load on the substrate W comprises three components, namely heat from radiation, heat from convection and heat from conduction. When the gas supplier 44 is not provided, in principle only conduction leads to heat transport through gas in the region between the projection system PS and the substrate W.

In an embodiment a the lithographic apparatus 100 comprises at least one optics zone gas supplier (not shown). The optics zone gas supplier is configured to supply a gaseous flow to the optics zone 50 side of the sealing aperture 40. The gaseous flow is for reducing particles that flow towards the member 43 coming into contact with the member 43. This gaseous flow has a similar function to the flow of gas supplied by the at least one gas supplier 44 at the substrate zone 60 side. The at least one optics zone gas supplier is optional.

It is desirable to reduce the conductive heat load on the substrate W. The conductive heat load on the wafer may be thought of as being made up of two components. One component is the heat conducted from the member 43 onto the substrate W. The other component is the heat conducted from the hollow part 41 onto the substrate W. The heat conducted from the hollow part onto the substrate W can be negative by providing that the temperature of the hollow part 41 is less than the temperature of the substrate W. This can be done by using the conditioning system 45. The conditioning system 45 is used to lower the temperature of (i.e. cool) the hollow part 45. This reduces the conductive heat load on the substrate W.

Simulations have been performed to estimate the effect of providing the inner surface 42 of the hollow part 41 with a surface treatment configured to increased absorption of IR radiation. In a particular simulation, the surface treatment was a coating of black chromium. In the simulation the hollow part 41 was cone-shaped.

According to a first simulation, no gas supplier 44 was provided to the lithographic apparatus 100. In the first simulation, the provision of the black chromium coating to the inner surface 42 of the hollow part 41 reduced the heat load on the substrate W by about 50%.

In a second simulation, a gas supplier 44 was provided to the lithographic apparatus 100. In the second simulation, the black chromium coating reduced the heat load on the substrate W by about 9%. Hence, in both simulations the black chromium coating reduced the heat load on the substrate W, albeit more effectively when the gas supplier 44 was not provided.

In an embodiment the hollow part 41 comprises a conditioning system 45 to condition the temperature of the hollow part 41. By conditioning the temperature of the hollow part 41, the heat load on the substrate W can be decreased. The temperature of the hollow part 41 has an effect on the heat load on the substrate W. The conditioning of the hollow part 41 helps the hollow part 41 to absorb more of the IR radiation. The conditioning of the hollow part 41 results in more IR radiation heat to be transferred to the hollow part 41. When a gas supplier 44 is provided, the temperature of the gas flow from the gas supplier 44 has an effect on the heat load on the substrate W. In an embodiment, cooling of the hollow part 41 reduces the heat load on the substrate W.

In an embodiment the hollow part 41 is formed of a material having higher thermal conductance at 295K than stainless steel. The thermal conductance of stainless steel is about 16 W/m·K at 295K. By providing that the hollow part 41 is formed of a material having higher thermal conductance than stainless steel, the effectiveness of the conditioning system 45 is greater compared to if stainless steel were used as the material to form the hollow part 41.

In an embodiment the hollow part 41 is formed of a material having a thermal conductance of at least 20 W/m·K at 295K, which is greater than the thermal conductance of stainless steel. In an embodiment the hollow part 41 is formed of a material having a thermal conductance of at least 200 W/m·K at 295K. In an embodiment the hollow part 41 is formed of a material having a thermal conductance of at least 250 W/m·K at 295K.

In an embodiment the hollow part 41 is formed of a material selected from a group consisting of aluminum, ceramic, SiSiC and aluminum nitride. These materials have a relatively high thermal conductance. This improves the effectiveness of the conditioning system 45, which in turn improves the heat load on the substrate W. The hollow part 41 may be formed of another suitable material having a relatively high thermal conductance, for example at least 200 W/m·K at 295K.

In an embodiment the conditioning system 45 conditions the temperature of the hollow part 41 so as to control the temperature difference between the inner surface 42 of the hollow part 41 and the member 43. The temperature difference between the inner surface 42 of the hollow part 41 and the member 43 drives the radiation power directed towards the inner surface 42. By controlling the temperature difference, the amount of radiation directed to the inner surface 42 from the membrane 43 can be controlled. In turn this allows the heat load on the substrate W to be controlled, at least to a certain extent.

In an embodiment the lithographic apparatus 100 may be provided with one or more temperature sensors configured to measure the temperature of the inner surface 42 of the hollow part 41. The lithographic apparatus 100 may comprise a controller (not shown) configured to control the conditioning system 45 to condition the temperature of the hollow part 41. The temperature sensors may provide data regarding the temperature of the inner surface 41 to the controller. The controller may use the data to control the conditioning system 45 to condition the temperature of the hollow part 41.

In a simulation the effect of thermally conditioning the hollow part 41 was measured. In a third simulation, a gas supplier 44 was provided to the lithographic apparatus 100. The conditioning system 45 was simulated to condition the temperature of the hollow part 41 to be cooled to 275K instead of 295K.

In the third simulation in which the inner surface 42 of the hollow part 41 was not provided with a surface treatment, the thermal conditioning (i.e. cooling), such that the temperature of the inner surface 42 of the hollow part 41 was 275K, reduced the heat load on the substrate W by about 35%. In other words, only decreasing the temperature of the inner surface 42 of the hollow part 41 provides an improvement of about 35%. By cooling the inner surface 42 of the hollow part 41 to 285K, the heat load on the substrate W was reduced by about 17%. In a fourth simulation in which the inner surface 42 was provided with the black chromium coating, the effect of the thermal conditioning was to reduce the heat load on the substrate W by about 50%.

When the black chromium coating and the thermal conditioning are applied to the lithographic apparatus 100, such that the temperature of the inner surface 42 of the hollow part 41 was 275K, then the combined effect is to reduce the heat load on the substrate W by about 54%. In other by additionally applying the surface treatment provides a further improvement of about 19% such that the combined improvement is about 35%+19%=54%. By cooling the inner surface 42 of the hollow part 41 to 285K (instead of 275K), the combined effect of the cooling and the surface treatment is to reduce the heat load on the substrate W by about 31%. Hence, the combined effect of applying the black chromium coating and cooling the hollow part 41 is greater than the individual effect of either the black chromium coating or the cooling of the hollow part 41.

In an embodiment the surface treatment is applied to the inner surface of the hollow part 41 and the hollow part 41 comprises a conditioning system 45. In this case the combination of the surface treatment (e.g. a coating) and conditioning (e.g. cooling) of the hollow part 41 is synergetic. The cooled inner surface (e.g. coating) of the hollow part 41 can absorb the heat of the non-EUV radiation even better than when the inner surface of the hollow part 41 is not cooled.

By providing the condition system 45 in the hollow part 41, it is possible to condition the gas supplied by the gas supplier 44 when the gas is within the hollow part 41. Hence, the temperature of the gas can be conditioned more effectively compared to a situation where the gas is conditioned a distance away from the hollow part 41. If the gas were conditioned away from the hollow part 41, then the gas would begin to heat again in the gas flow path between where the gas is cooled and where the gas enters the hollow part 41. This heating up would be more pronounced in situations where the gas flow rate is lower.

In an embodiment the gas flow rate is in the region of from about 15 mbar·L/s to about 30 mbar·L/s. This is considered to be a relatively low gas flow rate. A relatively low gas flow rate may be desirable because the member 43 blocks the gas from flowing upwards above the hollow part 41. The member 43 also blocks particles that could otherwise travel between the zones. Hence the gas flow is not required to be fast in order to block particles that would otherwise travel between the zones. Accordingly, a relatively low gas flow rate may be desirable. Substantially all of the gas flows downwards below the hollow part 41 towards the substrate W.

In an embodiment the conditioning system 45 is configured to thermally condition a section of the hollow part 41 on the same side of the member 43 as the gas supplier 44. For example, as shown in FIG. 5, in an embodiment the gas supplier 44 is provided below the member 43. The member 43 is configured to block a flow of gas between the zones 50, 60. By thermally conditioning the section of the hollow part 41 on the same side of the member 43 as the gas supplier 44, the conditioning system 45 is particularly effective in thermally conditioning the gas supplied by the gas supplier 44. By cooling the gas, the thermal load on the substrate W is reduced. In particular by cooling the gas at the hollow part 41 itself, the gas has less opportunity to heat after being cooled.

In an embodiment the conditioning system 45 is configured to thermally condition sections of the hollow part 41 both on the same side of the member 43 as the gas supplier 44 and on the opposite side of the member 43 as the gas supplier 44. By additionally thermally conditioning the section of the hollow part 41 above the member 43, there is a reduced amount of heat radiated towards the optics in the optics zone 50. This reduces mirror defects.

In an embodiment, the inner surface 42 of the hollow part 41 has a higher absorptivity value than stainless steel for IR radiation at 295K. For example, in an embodiment the hollow part 41 may be formed of a material that has higher absorptivity of IR radiation at 295K than stainless steel. In this case, even without providing a surface treatment to the inner surface 42, the thermal load on the substrate W is reduced.

As depicted in FIG. 5, the conditioning system 45 may comprise one or more channels within the main body of the hollow part 41. The channels within the main body of the hollow part 41 are for containing a conditioning fluid. The conditioning fluid may be $CO_2$. The conditioning system 45 may comprise a $CO_2$ conditioning system. A $CO_2$ conditioning system takes advantage of the transition point between the vapour and liquid phases of $CO_2$. The pressure is controlled to take advantage of the transition point.

As depicted in FIG. 5, a conditioning fluid channel 47 may be provided for supplying conditioning fluid to the channels of the conditioning system 45 within the main body of the hollow part 41. The conditioning fluid channel may be in fluid communication with a control unit 46 that supplies the conditioning fluid. In an embodiment the control unit 46 controls the pressure of the conditioning unit such that the conditioning fluid is at or near a transition point.

In an embodiment the conditioning system 45 comprises one or more Peltier elements positioned on a surface of, or within, the hollow part 41. The Peltier elements can be used to control the temperature of the hollow part 41.

In an embodiment the hollow part is provided with insulation 48. In an embodiment the insulation comprises a layer of insulation 48 surrounding the hollow part. The insulation 48 insulates the main body of the hollow part 41 from the environment external to the hollow part 41. The insulation 48 helps to maintain the temperature of the hollow part 41 to be lower than the external environment.

Figure 6:
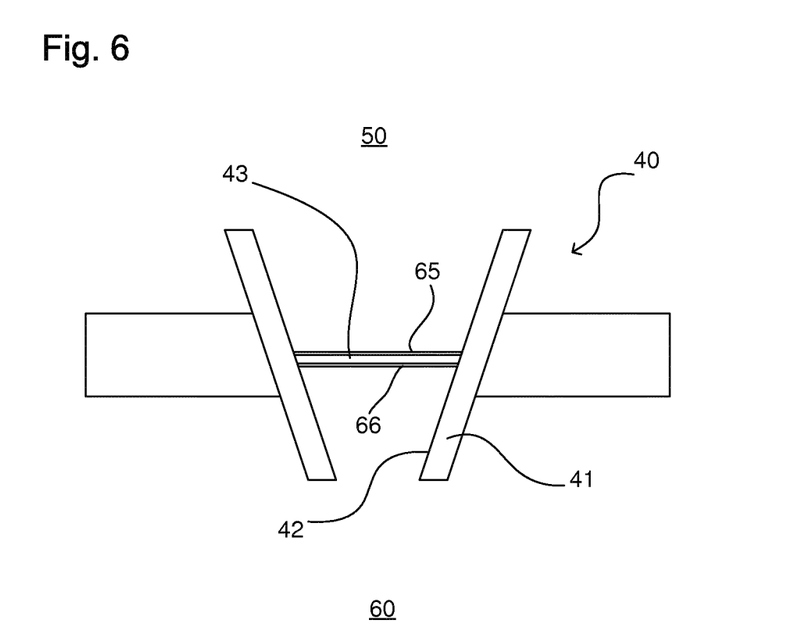
FIG. 6 depicts schematically part of a lithographic apparatus according to an embodiment of the present invention.

FIG. 6 depicts part of a lithographic apparatus 100 according to an embodiment of the invention. The same reference numerals are used for corresponding components in other figures. The description of components may be omitted below because the components have the same structure and arrangement as described above.

As depicted in FIG. 6, in an embodiment at least one surface of the member 43 has a filtration surface treatment configured to increase filtration of the non-EUV radiation between the zones 50, 60. By providing the filtration surface treatment, a wider selection of materials can be used for forming the member 43. For example, in an embodiment the member 43 is formed of a material that does not substantially filter the non-EUV radiation between the zones 50, 60. For example, the member 43 may be formed of a material that has a high transmittivity for IR radiation.

By providing the filtration surface treatment to the member 43, the member substantially filters the non-EUV radiation between the zones 50, 60. This allows the material of the member 43 to be selected for properties other than filtration of the non-EUV radiation. For example, the material for the member 43 may be selected for its good mechanical strength or for its ease of manufacture.

In an embodiment the member 43 has an upstream surface 62 and a downstream surface 63. The upstream surface 62 and the downstream surface 63 are referenced in FIG. 4. The upstream surface 62 faces the optics zone 50. The downstream surface 63 faces the substrate zone 60.

In an embodiment the filtration surface treatment comprises a reflection surface treatment 65. In an embodiment the upstream surface 62 of the member 43 has the reflection surface treatment 65. The reflection surface treatment 65 is configured to increase reflection of the non-EUV radiation. In FIG. 6, the reflection surface treatment 65 is provided at the upstream surface 62 that faces the optics zone 50. However, this need not necessarily be the case. In an embodiment the reflection surface treatment 65 is provided at the downstream surface 63 that faces the substrate zone 60.

In an embodiment the reflection surface treatment 65 comprises a coating of a reflective material. The reflective material is not particularly limited. The reflective material has higher reflectivity than the material of the member 43. In an embodiment the reflective material has higher reflectivity at 295 K for IR radiation compared to the material from which the member 43 is formed. In an embodiment the reflective material has a high transmission for EUV. In an embodiment the reflective material is aluminum.

In an embodiment the filtration surface treatment comprises an absorption surface treatment 66. In an embodiment the absorption surface treatment 66 is configured to increase absorption of the non-EUV radiation at the member 43. In an embodiment the downstream surface 63 of the member 43 has the absorption surface treatment 66. In an embodiment the absorption surface treatment 66 is configured to increase emissivity of the member 43. Within the IR radiation spectrum, emissivity is closely correlated to absorptivity. The greater the absorptivity, the greater the emissivity. By applying the absorption surface treatment configured to increase absorption of IR radiation, the emissivity of the member 43 is increased.

In FIG. 6 it is depicted that the downstream surface 63 that faces the substrate zone 60 has the absorption surface treatment 66. However, this need not necessarily be the case. In an embodiment the absorption surface treatment 66 is provided at the upstream surface 62 that faces the optics zone 50.

In an embodiment the absorption surface treatment 66 comprises a coating of an absorptive material at, e.g., the downstream surface 63 of the member 43. The absorptive material has higher absorptivity than the material of the member 43. In an embodiment the absorptive material has a higher absorptivity for IR radiation at 295 K compared to the material of the member 43. In an embodiment the absorptive material has a high transmission for EUV. In an embodiment the absorptive material is molybdenum.

In an embodiment the absorption surface treatment 66 comprises a coating of an emissive material at, e.g., the downstream surface 63 of the member 43. The emissive material has higher emissivity than the material of the member 43. In an embodiment the emissive material has a higher emissivity for IR radiation at 295 K compared to the material of the member 43. In an embodiment the emissive material has a high transmission for EUV. In an embodiment the emissive material is molybdenum.

As depicted in FIG. 6, in an embodiment the upstream surface 62 of the member 43 has the reflection surface treatment 65 and the downstream surface 63 of the member 43 has the absorption surface treatment 66. However, this need not necessarily be the case. In an embodiment the upstream surface 62 of the member 43 has a reflection surface treatment 65 and the downstream surface 63 has no filtration surface treatment. In an embodiment the downstream surface 63 of the member 43 has a reflection surface treatment 65 and the upstream surface 62 has no filtration surface treatment. In an embodiment the upstream surface 62 of the member 43 has an absorption surface treatment 66 and the downstream surface 63 has no filtration surface treatment. In an embodiment the downstream surface 63 of the member 43 has an absorption surface treatment 66 and the upstream surface 62 has no filtration surface treatment. In an embodiment, the upstream surface 62 and the downstream surface 63 of the member 43 have a reflection surface treatment 65. In an embodiment, the upstream surface 62 and the downstream surface 63 of the member 43 have an absorption surface treatment 66.

By providing the reflection surface treatment 65, more of the non-EUV radiation between the zones 50, 60 is reflected at the member 43. Accordingly, the proportion of non-EUV radiation such as IR radiation that is transmitted through the member 43 is reduced. An embodiment of the invention is expected to achieve a reduction in heating of the substrate W by non-EUV radiation.

By providing the absorption surface treatment 66, more power is emitted away from the member 43. Power is absorbed at the member 43. Depending on the material of the member 43, the proportion of absorbed power that is subsequently emitted may be low. By providing the absorption surface treatment 66, the proportion of absorbed power emitted away from the member 43 may be increased. An embodiment of the invention is expected to achieve a reduction in heating of the member 43 by non-EUV radiation. An embodiment of the invention is expected to achieve an increased lifetime for the member 43 by reducing the heating of the member 43 during use. The lifetime of the member 43 can otherwise be limited if the temperature of the member 43 gets too high.

In an embodiment the member 43 is formed from a material that comprises silicon. In an embodiment the member 43 is formed from polycrystalline silicon, which is sometimes called polysilicon. Polycrystalline silicon has high transmission for EUV radiation. Polycrystalline silicon has good mechanical strength. It is easier to fabricate a member 43 formed from polycrystalline silicon than to fabricate a multi-lattice membrane.

Polycrystalline silicon substantially filters DUV radiation. However, polycrystalline silicon has a poor capability of filtering IR radiation. By providing at least one surface of the member with the filtration surface treatment, filtration of the IR radiation is increased. Accordingly, polycrystalline silicon is a suitable material for forming the member 43.

An embodiment of the invention is expected to achieve substantial filtering of DUV radiation and substantial filtering of IR radiation, for example by reflection. An embodiment of the invention is expected to achieve an improvement in overlay by reducing heating of the substrate W by non-EUV radiation. An embodiment of the invention is expected to achieve an increase in the lifetime of the member 43. This is because the increased emission of radiation away from the absorption surface treatment 66 can have a cooling effect on the member 43.

In use the member 43 is heated by the EUV radiation. This is because the member 43 has an absorbing nature for the EUV radiation. By providing absorption surface treatment 66, the emissivity of the member 43 is increased for EUV radiation. By increasing the emissivity of EUV radiation, the temperature of the member 43 can be reduced.

In an embodiment the member 43 is formed from polycrystalline silicon and has a thickness of 60 nm. A 4 nm thick coating of molybdenum is provided at one surface 63 of the member 43. A 4 nm thick coating of aluminum is provided at the opposite surface 62 of the member 43. Such an exemplary embodiment of the invention is expected to achieve about 80% reflection of IR radiation back into the optics zone 50. Such an exemplary embodiment of the invention is expected to achieve absorption of about 15% of IR radiation.

The specific metals and corresponding thicknesses mentioned above result in the above-mentioned absorption and reflection values. However, these specific metals and corresponding thicknesses serve as an example only. As explained below, the thicknesses of the member 43 and the coatings can be tuned so as to provide the desired optical properties. Additionally, the type of metal of the coatings can be tuned so as to provide the desired optical properties.

Instead of tuning the design of a single specific coating with an engineered material or multilayer to provide desired absorption and reflection values, the individual effects can be accomplished by providing two different (and simpler) coatings on either side of the member 43, so that the desired effect is achieved in a distributed way. By choosing the top and bottom materials for the coatings appropriately, as well as their thickness, it is possible to achieve the desired effects in a simpler way instead of developing a single material or multilayer (and associated process) to be applied on both sides. An additional effect of this dual (or distributed) coating strategy is containment, as explained in further detail below.

Individual coating thicknesses can be modified for a desired effect. For example, increasing the molybdenum coating from 4 nm to a thickness of 6 nm and decreasing the aluminum coating from 4 nm to 2 nm is expected to reduce the reflection of IR radiation to about 65%, while maintaining a transmission of IR radiation of about 15%. An IR radiation transmission of about 15% may still be acceptable for lithographic applications. In an embodiment the thickness of the filtration surface treatment is at most 10 nm. The transmission of EUV radiation decreases with increasing thickness of the filtration surface treatment. By providing that the thickness of the filtration surface treatment is at most 10 nm, the transmission of EUV radiation is sufficiently high.

Individual coating thicknesses can be tuned to reduce reflection of IR radiation to optics of the lithographic apparatus 100 to manageable levels.

Figure 7:
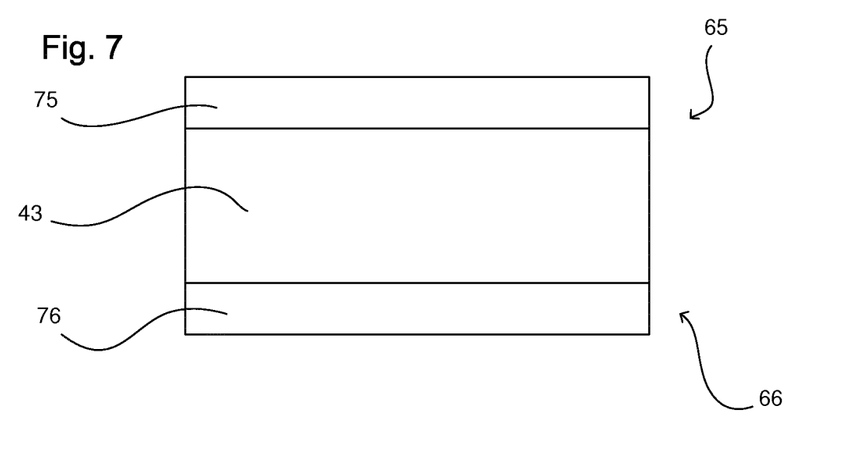
FIG. 7 depicts schematically part of a lithographic apparatus according to an embodiment of the present invention.

FIG. 7 depicts part of a lithographic apparatus 100 according to an embodiment of the invention. The same reference numerals are used for corresponding components on other Figures.

FIG. 7 is a close-up view of the member 43 of the lithographic apparatus 100. The member 43 has an upstream surface 65 and a downstream surface 66. As depicted in FIG. 7, in an embodiment the upstream surface 65 has an upstream containment layer 75. In an embodiment the downstream surface 66 has a downstream containment layer 76. The upstream containment layer 75 is a layer of upstream containment material. The downstream containment layer 76 is a layer of downstream containment material.

The upstream containment layer 75 and the downstream containment layer 76 are configured to contain the material between the upstream containment layer 75 and the downstream layer 76 from which the member 43 is formed.

By providing the upstream containment layer 75 and the downstream containment layer 76, distribution of debris when the member 43 breaks is reduced. During use of the lithographic apparatus 100, it is possible for the member 43 to break. When the member 43 breaks, the member 43 can break up into many particles. In particular, if the member 43 is formed from a material having a brittle nature, the member 43 can shatter into many particles when the member 43 breaks. The debris from the broken member 43 can contaminate other parts of the lithographic apparatus 100. For example, debris from the broken member 43 can contaminate optical components in the optic zone 50 and can contaminate optical components in the substrate zone 60. Contamination from the debris of the broken member 43 can reduce the quality of optical functions carried out by the optical components in the substrate zone 60 and the optic zone 50.

For example, in an embodiment the member 43 is formed from polycrystalline silicon. Polycrystalline silicon has a brittle nature. Hence, a member 43 formed from polycrystalline silicon can shatter into many particles when the member 43 breaks.

By providing the upstream containment layer 75 and the downstream layer 76, the mechanical properties of the member 43 together with the upstream containment layer 75 and the downstream containment layer 76 can be improved. The upstream containment material and the downstream containment material can be selected so as to achieve desired mechanical properties for the combination of the member 43 with the upstream containment layer 75 and the downstream containment layer 76. The upstream containment layer 75 has an upstream containment layer thickness. The downstream containment layer 76 has a downstream containment layer thickness. In an embodiment, the upstream containment layer thickness and the downstream containment layer thickness are selected so as to achieve desired mechanical properties. The mechanical properties may include mechanical strength, the deflection of the member 43 due to a pressure difference across the member 43, and the behaviour of the member 43 when the member 43 ruptures.

In an embodiment the upstream containment material is a metal. In an embodiment the downstream containment material is a metal. In an embodiment the upstream containment material and the downstream containment material are more flexible than the base material between the upstream containment layer 75 and the downstream containment layer 76 from which the member 43 is formed. For example, the base material from which the member 43 is formed may be polycrystalline silicon. The more flexible upstream containment layer 75 and the more flexible downstream containment layer 76 help to contain the brittle polycrystalline silicon material.

In an embodiment, the reflection surface treatment and/or the filtration surface treatment described in relation to FIG. 6 may serve as the upstream containment layer 75 and the downstream containment layer 76. For example, the upstream containment layer 75 may be formed from molybdenum or aluminum. In an embodiment the downstream containment layer 76 may be formed from molybdenum or aluminum.

As depicted in FIG. 7, in an embodiment the downstream containment layer thickness is approximately equal to the upstream containment layer thickness. In an embodiment the downstream containment material is the same as the upstream containment material. For example, the downstream containment material and the upstream containment material may be silicon nitride (SiNx). The layer of upstream containment material and the layer of downstream containment material may be called low stress layers. In an embodiment the upstream containment layer thickness is from about 2 nm to about 10 nm, more preferably from about 2 nm to about 4 nm, and maybe for example 3 nm. In an embodiment, the downstream containment layer thickness is from about 2 nm to about 10 nm, more preferably from about 2 nm to about 4 nm, and maybe for example 3 nm. In an embodiment the member 43 has a thickness in the region of from about 40 nm to about 70 nm, and maybe for example 55 nm.

Hence, in one embodiment, a polycrystalline silicon member 43 having a thickness of 55 nm is provided with an upstream containment layer 75 formed from silicon nitride having an upstream containment layer thickness of 8 nm and a downstream containment layer 76 formed from silicon nitride having a downstream containment layer thickness of 8 nm.

The upstream containment layer 75 and the downstream containment layer 76 are sometimes called capping layers.

Figure 8:
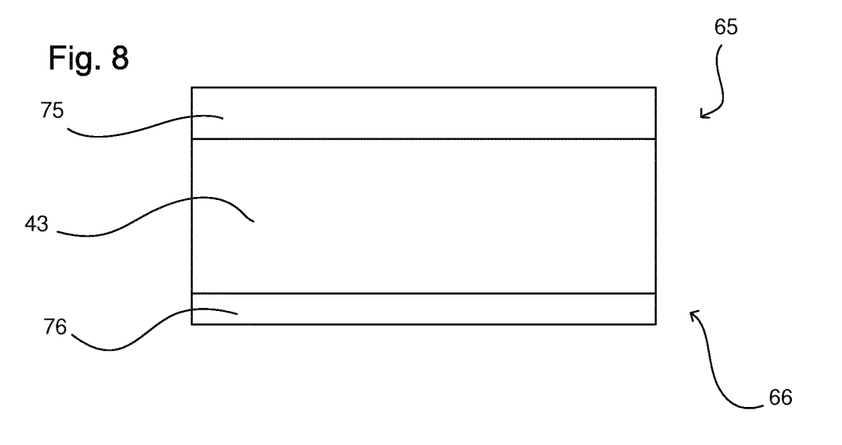
FIG. 8 depicts schematically part of a lithographic apparatus according to an embodiment of the present invention.

FIG. 8 depicts part of a lithographic apparatus 100 according to an embodiment of the invention. The same reference numerals are used for corresponding components in other figures. The description of components may be omitted below because the components have the same structure and arrangement as described above.

As depicted in FIG. 8, in an embodiment the upstream containment layer thickness is different from the downstream containment layer thickness. By providing that the upstream containment layer thickness is different from the downstream containment layer thickness, the behaviour of the member 43 when the member 43 breaks can be controlled. For example, the thickness difference between the upstream containment layer 75 and the downstream containment layer 76 can be used to increase the possibility that the shape of the member 43 curls in a preferable direction when the member 43 breaks. In an embodiment, the upstream containment layer thickness is less than the downstream containment layer thickness so that the member 43 curves downstream.

In an embodiment the upstream containment material and the downstream containment material are molybdenum. In an embodiment the upstream containment layer thickness is in the range from about 4 nm to about 8 nm, and may be for example 6 nm. In an embodiment, the downstream containment layer thickness is in the range of from about 2 nm to about 4 nm, and may be for example 3 nm. In an embodiment the member 43 has a thickness in the range of from about 2 nm to about 40 nm, and may be for example 30 nm.

Hence, in an embodiment a polycrystalline silicon member 43 having a thickness of 30 nm is provided with an upstream containment layer 75 formed from molybdenum having an upstream containment layer thickness of 6 nm and a downstream containment layer 76 formed from molybdenum having a downstream containment layer thickness of 3 nm.

As explained above, the upstream containment layer 75 and the downstream containment layer can improve the effective mechanical properties of the member 43. Additionally, the upstream containment layer 75 and the downstream containment layer 76 can improve the chemical stability of the member 43. In an embodiment, the upstream containment material and the downstream containment material are selected so as to provide desired spectral filtering capabilities for the combination of the member 43 with the upstream containment layer 75 and the downstream containment layer 76. For example, the upstream containment material and the downstream containment material can be selected to be molybdenum and aluminum so as to achieve desired absorption and reflection of non-desired non-EUV radiation.

Aluminum has been mentioned as an example of a material that may be used in embodiments of the invention. Aluminum is only one example of a suitable material and other materials are possible. In embodiments that include aluminum, the aluminum may be provided with an additional capping layer configured to reduce oxidization of the aluminum. Embodiments of the invention comprising a capping layer are expected to lengthen the lifetime of the member 43.

By controlling the behaviour of the member 43 when the member 43 breaks or ruptures, contamination caused by debris can be reduced. In particular, the thickness difference between the upstream containment layer 75 and the downstream containment layer 76 can encourage the member 43 to curl in a preferable direction such that the likelihood of contamination is reduced.

In an embodiment each of the upstream containment material and the downstream containment material is less brittle than the material between the upstream containment layer 75 and the downstream containment layer 76 from which the member 43 is formed.

Although specific reference may be made in this text to the use of a lithographic apparatus 100 in the manufacture of ICs, it should be understood that the lithographic apparatus 100 described herein may have other applications, such as the manufacture of integrated optical systems, guidance and detection patterns for magnetic domain memories, flat-panel displays, liquid-crystal displays (LCDs), thin-film magnetic heads, etc.

The skilled artisan will appreciate that, in the context of such alternative applications, any use of the terms "wafer" or "die" herein may be considered as synonymous with the more general terms "substrate" or "target portion," respectively. The substrate W referred to herein may be processed, before or after exposure, in for example a track (a tool that typically applies a layer of resist to the substrate W and develops the exposed resist), a metrology tool and/or an inspection tool. Where applicable, the disclosure herein may be applied to such and other substrate processing tools. Further, the substrate W may be processed more than once, for example in order to create a multi-layer IC, so that the term substrate W used herein may also refer to a substrate that already contains multiple processed layers.

While specific embodiments of the invention have been described above, it will be appreciated that the invention may be practiced otherwise than as described. For example, the hollow part 41 may have a shape other than cone-shaped, such as cylindrical. The coating may be provided to only a part of the inner surface of the hollow part 41.

The descriptions above are intended to be illustrative, not limiting. Thus it will be apparent to one skilled in the art that modifications may be made to the invention as described without departing from the scope of the claims set out below.

The invention claimed is:

1. An apparatus comprising:
   at least one sealing aperture comprising a hollow part, having an inner surface, extending at an interface between different zones of the apparatus; and
   a member positioned in the hollow part configured to substantially transmit EUV radiation and to substantially filter non-EUV radiation at the interface;
   wherein the inner surface of the hollow part has a surface treatment configured to increase absorption of the non-EUV radiation that is transferred by the member to the hollow part; and
   wherein the EUV radiation is transmitted from an upstream side of said member to a downstream side of said member, wherein the surface treatment is on the downstream side of said member.

2. The apparatus of claim 1, wherein the inner surface of the hollow part has an absorptivity of greater than 0.4 or at least 0.8 for IR radiation at 295K.

3. The apparatus of claim 1, wherein the inner surface of the hollow part has an emissivity of at least 0.3 or at least 0.9 for IR radiation at 295K.

4. The apparatus of claim 1, wherein the hollow part is formed of a material having higher thermal conductance than stainless steel.

5. The apparatus of claim 1, wherein the hollow part is formed of a material having a thermal conductance of at least 20 W/(m·K) or at least 200 W/(m·K) at 295K.

6. The apparatus of claim 1, wherein the hollow part is formed of a material selected from a group consisting of aluminum, ceramic, SiSiC and aluminum nitride.

7. The apparatus of claim 1, wherein the surface treatment is a coating.

8. The apparatus of claim 7, wherein the coating is formed of black chromium.

9. The apparatus of claim 1, wherein the surface treatment is on both the upstream side and the downstream side of said member.

10. The apparatus of claim 1, wherein the hollow part comprises a conditioning system to condition the temperature of the hollow part.

11. The apparatus of claim 10, wherein the conditioning system conditions the temperature of the hollow part so as to control the temperature difference between the inner surface of the hollow part and the member.

12. The apparatus of claim 1, comprising at least one gas supplier configured to supply gas to the sealing aperture so as to reduce particles that flow towards the member coming into contact with the member.

13. The apparatus of claim 12, wherein the conditioning system is configured to thermally condition a section of the hollow part on the same side of said member as said gas supplier.

14. The apparatus of claim 12, wherein the conditioning system is configured to thermally condition sections of the hollow part both on the same side of said member as said gas supplier and on the opposite side of said member as said gas supplier.

15. A device manufacturing method, comprising:
using a lithographic apparatus to transfer a pattern from a patterning device to a substrate, wherein the lithographic apparatus comprises:
at least one sealing aperture comprising a hollow part, having an inner surface, extending at an interface between different zones of the apparatus; and
a member positioned in the hollow part configured to substantially transmit EUV radiation and to substantially filter non-EUV radiation at the interface; wherein the inner surface of the hollow part has a surface treatment configured to increase absorption of the non-EUV radiation that is transferred by the member to the hollow part; and
transmitting the EUV radiation from an upstream side of said member to a downstream side of said member, wherein the surface treatment is on the downstream side of said member.

* * * * *